US010955446B2

(12) United States Patent
M S et al.

(10) Patent No.: US 10,955,446 B2
(45) Date of Patent: Mar. 23, 2021

(54) METHOD FOR ASCERTAINING THE PHASE CURRENTS OF AN ELECTRIC MACHINE INCLUDING A CONVERTER

(71) Applicants: Robert Bosch GmbH, Stuttgart (DE); SEG AUTOMOTIVE GERMANY GMBH, Stuttgart (DE)

(72) Inventors: Arunkumar M S, Kornwestheim (DE); Julian Roesner, Untergruppenbach (DE)

(73) Assignees: Robert Bosch GmbH, Stuttgart (DE); SEG Automotive Germany GmbH, Stuttgart (DE)

( * ) Notice: Subject to any disclaimer, the term of this patent is extended or adjusted under 35 U.S.C. 154(b) by 232 days.

(21) Appl. No.: 16/094,735

(22) PCT Filed: Apr. 3, 2017

(86) PCT No.: PCT/EP2017/057807
§ 371 (c)(1),
(2) Date: Oct. 18, 2018

(87) PCT Pub. No.: WO2017/190898
PCT Pub. Date: Nov. 9, 2017

(65) Prior Publication Data
US 2019/0120884 A1  Apr. 25, 2019

(30) Foreign Application Priority Data

May 4, 2016  (DE) .................. 10 2016 207 690

(51) Int. Cl.
*G01R 19/25* (2006.01)
*H02P 9/48* (2006.01)
(Continued)

(52) U.S. Cl.
CPC ............. *G01R 19/25* (2013.01); *G01R 25/00* (2013.01); *H02M 7/219* (2013.01); *H02P 6/28* (2016.02);
(Continued)

(58) Field of Classification Search
CPC ........... H02P 6/28; G01R 25/00; H02M 7/219
See application file for complete search history.

(56) References Cited

U.S. PATENT DOCUMENTS 5,388,052 A  *  2/1995  Mann ........................ B66B 1/30
187/391
9,225,264 B1  12/2015  Fedigan et al.
(Continued)

FOREIGN PATENT DOCUMENTS

DE  102012217116 A1  3/2014
WO  2014044526 A2  3/2014

OTHER PUBLICATIONS

International Search Report for PCT/EP2017/057807, dated Jun. 21, 2017.
(Continued)

*Primary Examiner* — Alvaro E Fortich
(74) *Attorney, Agent, or Firm* — Norton Rose Fulbright US LLP; Gerard Messina; Dervis Magistre (57) ABSTRACT

A method for ascertaining phase currents of an electric machine including a converter and stator including stator windings (phase number of at least three), in which the phase currents of measuring phases (at least two), are measured, the phase currents being measured in a measuring interval when the active switching elements of the measuring phases in a lowside path of the converter are activated in a switching interval delimited by a switching-on point-in-time and switching-off point-in-time, the phase currents of the remaining phases being determined arithmetically from (Continued)

the measured phase currents so that the measured phase currents, a spatial angle of the measuring phases, and a spatial angle of the remaining phases are used for arithmetic determination, in which the measuring interval is selected to be with respect to time outside a switching-on point-in-time or switching-off point-in-time of at least one of the active switching elements of the stator phases.

17 Claims, 4 Drawing Sheets

(51) Int. Cl.
    *H02P 6/28*     (2016.01)
    *G01R 25/00*     (2006.01)
    *H02M 7/219*     (2006.01)
    *H02M 1/00*     (2006.01)

(52) U.S. Cl.
    CPC ....... *H02P 9/48* (2013.01); *H02M 2001/0009* (2013.01)

(56) References Cited

U.S. PATENT DOCUMENTS

| | | | | |
|---|---|---|---|---|
| 9,859,823 | B2* | 1/2018 | Roesner | H02P 25/22 |
| 2009/0284194 | A1* | 11/2009 | Forte | H02M 7/53871 318/400.02 |
| 2011/0156664 | A1* | 6/2011 | Horihata | H02P 9/48 322/24 |
| 2015/0042246 | A1* | 2/2015 | Tadokoro | H02P 7/06 318/114 |
| 2015/0270797 | A1* | 9/2015 | Roesner | G01R 25/00 318/400.04 |

OTHER PUBLICATIONS

Chakrabarti, S., et al. "A Current Reconstruction Algorithm for Three-Phase Inverters Using Integrated Current Sensors in the Low-Side Switches", Conference Record of The 2003 IEEE Industry Applications Conference, 38th, IAS Annual Meeting, Salt Lake City, UT, New York, NY : IEEE, US, vol. 2, Oct. 12, 2003 (Oct. 12, 2003), p. 925-932, XP010676127.

* cited by examiner

METHOD FOR ASCERTAINING THE PHASE CURRENTS OF AN ELECTRIC MACHINE INCLUDING A CONVERTER

FIELD OF THE INVENTION

The present invention relates to a method for ascertaining the phase currents of an electric machine including a converter and a processing unit for carrying out the method.

BACKGROUND INFORMATION

Generators for converting mechanical energy into electrical energy are known. In general, claw pole generators are used in motor vehicles. They may be equipped with electrical excitation. Since claw pole generators generate three-phase current, rectification is necessary for the DC voltage vehicle electrical systems typical in motor vehicles. Rectifiers including semiconductor diodes and/or active switching elements may be used for this purpose.

Generators which are also used for the vehicle drive are known from the field of hybrid vehicles. They are to assist the internal combustion engine in particular when it does not (yet) supply its full torque (boost mode, turbo lag compensation). Motor-operable generators with their associated inverters are also referred to as electrical drives within the scope of this application.

An electrical drive may be controlled with the aid of a field-oriented controller, in which the phase currents (i.e., currents through the phases or stator winding strands) of the machine are ascertained and controlled to a setpoint value. In three-phase machines, two phase currents are typically measured, the third phase current may be ascertained arithmetically, since the total of all phase currents is zero.

Accordingly, in drives having more than three phases, N−1 phase currents have to be measured, N being the phase number of the drive.

For the field-oriented control, the measured phase currents are transformed into a rotating-field-fixed dq coordinate system. The individual phase currents are not significant for the control, but rather the computed current vector in the dq coordinate system. All phase currents have to be known or at least ascertainable arithmetically, however.

The phase currents may be measured via measuring resistors, so-called shunts. In general, the shunts are not installed directly in the phases of the drive, but rather in a lowside path of the converter. A measurement is therefore only possible at the points in time at which the phase current to be measured is negative, because the diodes or active switching elements situated in the lowside path of the converter only conduct then. Therefore, depending on the activation (in particular PWM mode or block mode) of the converter, only a few, permanently defined points in time exist at which a current measurement may take place. This is not satisfactory.

Since a certain minimum time is required for the current measurement, which essentially results from a settling time of the stator coils and the particular measuring times for the current measurement of the measuring phases, the known methods reach their limits, in particular if the degree of modulation is very high and the duration of the activated lowside paths is less than the duration required for the current measurement. Moreover, the current measuring windows required for the current measurement are further limited by the particular switching procedures of the highside switches and lowside switches used during active rectification, since potential differences are generated in the case of each switching on and switching off procedure, which result in variations in the phase current. These variations are typically not restricted to individual phases, since the phases are generally coupled to one another.

The provision of measuring resistors including the required measuring electronics is moreover complex, so that simplified devices and methods for ascertaining the phase currents are desirable. In particular, the demand exists for such simplified devices and methods which may be used both in the PWM mode and in the block mode.

A method is discussed in DE 102012217116, in which a number of phase currents of individual phases are measured, and the phase currents of the remaining phases are ascertained arithmetically on the basis of the measured phase currents.

SUMMARY OF THE INVENTION

According to the present invention, a method is provided for ascertaining the phase currents of an electric machine including a converter and a stator including stator windings having a phase number of at least three, and a processing unit for carrying out this method having the features of the independent patent claims. Advantageous embodiments are the subject matter of the subclaims and the following description.

The method according to the present invention includes measuring the phase currents of a number of measuring phases, which is at least two, and determining the phase currents of the remaining phases arithmetically from the phase currents measured with respect to the measuring phases. The measuring effort may thus be substantially reduced and/or the time spans at which measurements may be carried out may be lengthened. The phase currents of the measuring phases are determined for this purpose in a measuring interval, the measuring interval in turn lying within a switching interval of the active switching elements associated with the measuring phases in a lowside path. The switching interval has switching-on points in time and switching-off points in time for this purpose. The phase currents are therefore ascertained during an active circuit of the particular lowside paths.

In particular the measured phase currents in absolute value and phasing and the spatial angle of the individual stator winding strands and/or the spatial angle offset of the individual stator winding strands in relation to one another are used for the arithmetic determination of the remaining phase currents.

Within the scope of the present application, "phase number" refers to the total number of the phases (stator winding strands) of the electric machine. In an electric machine having five stator winding strands, it is thus five. "Measuring phases" refers within the scope of the present invention to those phases of the electric machine, whose phase currents are actually measured via corresponding measuring units, for example, measuring resistors. The measuring phases do not necessarily have to be fixed, for example, these may also be those phases which are measurable in a certain switching state. However, they have suitable measuring units either individually or also, for example, in pairs. The phase currents of the "remaining phases" are not measured at least in the particular observed measuring and/or switching cycle. The phase number thus results by adding the number of the measuring phases and the number of the remaining phases.

The accuracy and reproducibility of the phase currents of the measuring phases and the accuracy and reproducibility of the remaining phase currents ascertained therefrom are moreover decisively dependent on the measuring interval, in which the phase currents of the measuring phases are determined, being selected, which may be for each switching cycle, in such a way that, on the one hand, the phase currents of the measuring phases required for the determination of all phase currents may be ascertained and, on the other hand, the measuring interval is positioned with respect to time in such a way that the measurements of the phase currents are not influenced by the circuit of the active switching elements and the potential variations linked thereto. This is achieved according to the present invention in that the measuring interval always lies with respect to time outside the switching-on points in time or the switching-off points in time of the active switching elements associated with the phases of the stator. Accordingly, there is no overlap with respect to time.

The measuring interval may have a minimum duration, which is essentially provided by a settling time of at least one of the stator windings and the measuring time which is required for determining the particular phase currents of the individual measuring phases. In this way, it may be ensured that the overall system of the phase windings is in an equilibrium state and the further phase currents derived from the phase currents of the measuring phases are exactly ascertainable.

Moreover, it furthermore may be that neither the active switching elements of a highside path nor the active switching elements of a lowside path are interconnected during a measuring interval. It may be ensured in this way that the variations in the phase current caused by the potential variations have subsided and it is not necessary to wait out a further settling time of the stator windings to perform a measurement of the particular phase currents.

In another embodiment of the present invention, it may be provided for the switching-on points in time and the switching-off points in time to be determined and sorted in chronological sequence, the time difference between a switching-on point in time or a switching-off point in time and the directly adjacent switching-on point in time or switching-off point in time being determined and compared to the measuring interval, in particular to the chronological duration of the measuring interval. It furthermore may be provided for the time difference(s) to be identified, whose chronological duration at least corresponds to the chronological duration of the measuring interval. In principle, the potentially usable measuring windows for ascertaining a phase current lie between the switching pulses of the active switching elements. By ascertaining the time difference between the switching pulses and comparing this time difference to the measuring interval required for a measurement, the time ranges may be identified within a cycle, at which a measurement of the phase currents of what may be many phases may be ensured.

In another embodiment of the present invention, the measuring interval is selected and situated with respect to time between the particular switching-on points in time or switching-off points in time in such a way that at least two phase currents, which may be the greatest possible number of phase currents, may be measured within the measuring interval. The arithmetic ascertainment of the further phase currents may be carried out more exactly due to the measurement of more than two phase currents. Moreover, within the potential measuring windows, ascertaining the number of the possible phase current measurements which are measurable within a measuring interval may be provided within the scope of the method according to the present invention. The measuring window may therefore be selected which permits the greatest possible number of phase current measurements, whereby the phase currents ascertained arithmetically are accordingly determinable more exactly.

As explained at the outset, $N-1$ phase currents have to be measured in conventional methods in electric machines having more than three phases, i.e., the number of the measuring phases is $N-1$ and the number of the remaining phases is 1. According to the present invention, in contrast, in the simplest case, the measurement of the phase currents of only two measuring phases is sufficient to ascertain all phase currents, the phase currents of the remaining phases may be determined therefrom arithmetically.

An electric machine having a phase number of three is required for the ascertainment according to the present invention of the phase currents. The advantages underlying the present invention result in particular for electric machines having a phase number of four or more phases, and it is therefore suitable in particular for such electric machines. The present invention is suitable in particular for electric machines including converters which are used in so-called boost recuperation systems in motor vehicles.

The method according to the present invention may be supplemented by a selection advantageous in terms of measurement and evaluation of the particular phases to be measured and the current measuring points in time as a function of the particular selected activation pattern. The present invention may also include a measurement of corresponding phase currents in a shared line, to which multiple phases are connected, so that the evaluation is made significantly simpler than in the related art. The current in the shared line results accordingly as the aggregate current of the individual phase currents. At the same time, a valid current vector in the dq coordinate system may be ascertained at a very large number of points in time both in the case of PWM activation and block activation by the provided measures.

One essential advantage of the present invention is therefore in particular a savings of current measuring units in the drive and thus a reduction of the installation size and the manufacturing costs, on the one hand, and an expansion of possible measuring points in time, on the other hand.

A processing unit according to the present invention, for example, a charge control unit of a motor vehicle, is configured, in particular by programming, to carry out a method according to the present invention.

The implementation of the method in the form of software is also advantageous, since this entails particularly low costs, in particular if an executing control unit is also used for further tasks and is therefore present in any case. Suitable data carriers for providing the computer program are in particular diskettes, hard drives, flash memories, EEPROMs, CD-ROMs, DVDs, etc. A download of a program via computer networks (Internet, intranet, etc.) is also possible.

Further advantages and embodiments of the present invention result from the description and the appended drawings.

The present invention is schematically illustrated in the drawings on the basis of exemplary embodiments and will be described in greater detail hereafter with reference to the drawings.

DETAILED DESCRIPTION

Figure 1:
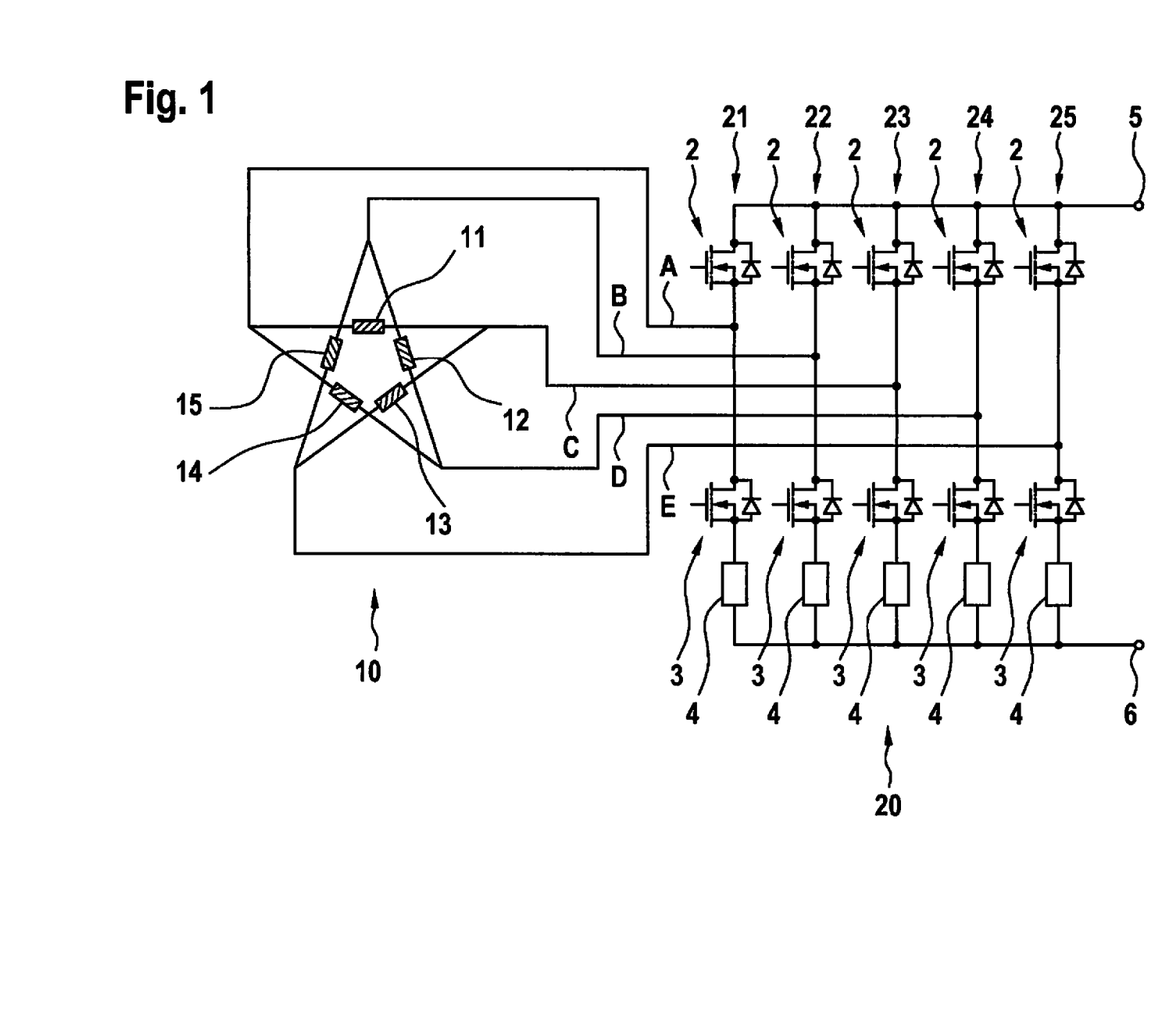
FIG. 1 shows an electric machine including a converter, as it may underlie the present invention, in a schematic view.

FIG. 1 shows the elements essential for illustrating the present invention of an electric machine including a converter in a very simplified view, as it may be part of a motor vehicle electrical system. This includes a five-phase stator 10. Five-phase stator 10 has a total of five stator winding strands (also referred to as stator windings) 11 through 15. A rotor is not shown for the sake of clarity.

Five-phase stator 10 is connected with its five stator winding strands 11 through 15 to a converter 20, which has five converter bridges 21 through 25 including active switching elements 2, 3, for example, MOSFETs. Five stator winding strands 11 through 15 and five converter bridges 21 through 25 define five phases A through E of the electric machine. Converter 20 may be operated as a rectifier (typically in a generator mode of the electric machine for supplying the vehicle electrical system) or as an inverter (typically in a motor operation of the electric machine).

Active switching elements 2, 3 are connected via busbars to stator winding strands 11 through 15, on the one hand, and DC voltage terminals 5, 6, on the other hand. DC voltage terminals 5, 6 may be connected to a power storage unit in a vehicle electrical system, for example, a battery. DC voltage terminal 5 is connected to the positive battery pole and DC voltage terminal 6 is connected to the negative battery pole or to ground. Active switching elements 2 are thus situated in the so-called upper rectifier branch and active switching elements 3 in the lower rectifier branch. Active switching elements 2 are thus so-called highside switching elements and active switching elements 3 are so-called lowside switching elements. One also refers to a highside path (from the center point of particular converter bridges 21 through 25 via switching elements 2 to DC voltage terminal 5) or a lowside path (from the center point of particular converter bridges 21 through 25 via switching elements 3 to DC voltage terminal 6).

A current measurement conventionally takes place via measuring resistors (shunts) 4 in the lowside paths of converter 20. Of course, however, the phase currents may only be measured at this point when associated lowside switching element 3 is switched on. However, this in turn is only the case when the corresponding phase current is negative.

As already explained above, numerous disadvantages result in the case of a conventional current measurement. These may be overcome according to the present invention, the present invention being illustrated hereafter with reference to the PWM mode and the block mode.

Figure 2:
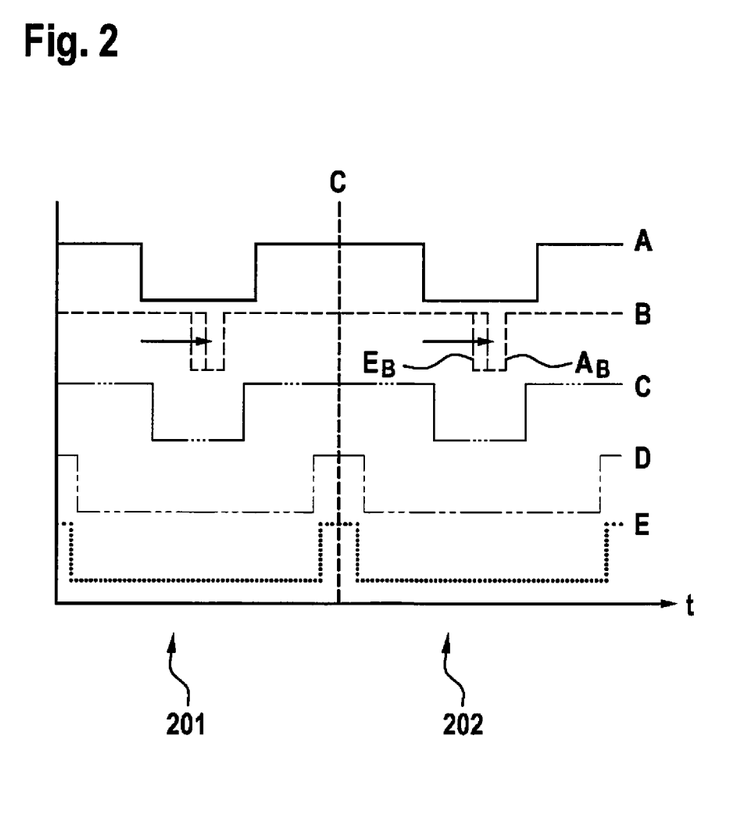
FIG. 2 shows a PWM activation diagram for an electric machine including a converter according to FIG. 1 and an ascertainment of the phase currents according to the related art in a schematic view.

A PWM activation diagram according to a so-called center-aligned method is illustrated in FIG. 2. The method according to the present invention may also be applied, however, with other PWM methods, for example, the so-called edge-aligned method. FIG. 2 shows the switching state of the highside switching elements (cf. switching elements 2 of FIG. 1) in corresponding phases A through E of a five-phase electrical machine over a time t. The corresponding lowside switching elements (for example, switching elements 3) are activated exactly inversely thereto. FIG. 2 shows an activation within multiple activation periods plotted over time t. The block widths of the individual phases are decisive for the level of the phase current to be set.

In the center-aligned method, the activation blocks are situated symmetrically in relation to a center line C. The activation pattern repeats with a constant frequency, the activation widths being changed as a function of the rotation angle. The frequency is typically in the range of, for example, 16 kHz and is selected in such a way that, on the one hand, noise resulting therefrom is above the audible frequency range, on the other hand, the losses arising during the switching of the MOSFETs may be low. FIG. 2 shows the switching states of highside switches 2, particular lowside switches 3 being switched inversely in principle to highside switches 2 associated with them. Lowside switches 3 are therefore switched on in areas of lower plateaus.

A current measurement is conventionally carried out within time intervals 201, 202, in which all lowside switching elements 3 are switched on (and thus the highside switching elements are switched off), i.e., during an activation window of lowside switching elements 3, as shown in FIG. 2 by shaded areas. However, the phase currents of all phases A through E may still be ascertained if the phase currents of N−1 phases are measurable. If one of the activation windows of lowside switching elements 3 is so short that the phase current is not ascertainable (cf. phase B), the activation duration of particular lowside switching element 3 (cf. phase B) thus accordingly has to be lengthened by a shift of switching-on points in time $E_B$ or switching-off points in time $A_B$ (shown by arrows in FIG. 2). Such a change of the pulse pattern results in increased torque and voltage ripple and should therefore be avoided, however.

However, if only three or only two phase currents are measured, as may be provided according to the present invention, the measurement may take place at any point in time at which the lowside switching elements are closed in the particular branches to be measured, i.e., in the measuring phases. With respect to two phases, this is fundamentally the case in periods 203, 204 in the activation diagram shown in FIG. 3, in which at least two of lowside switches 3 are switched on simultaneously. In these periods, at least the lowside switching elements are always switched on in phases D and E, and therefore their phase currents may be measured.

Figure 3:
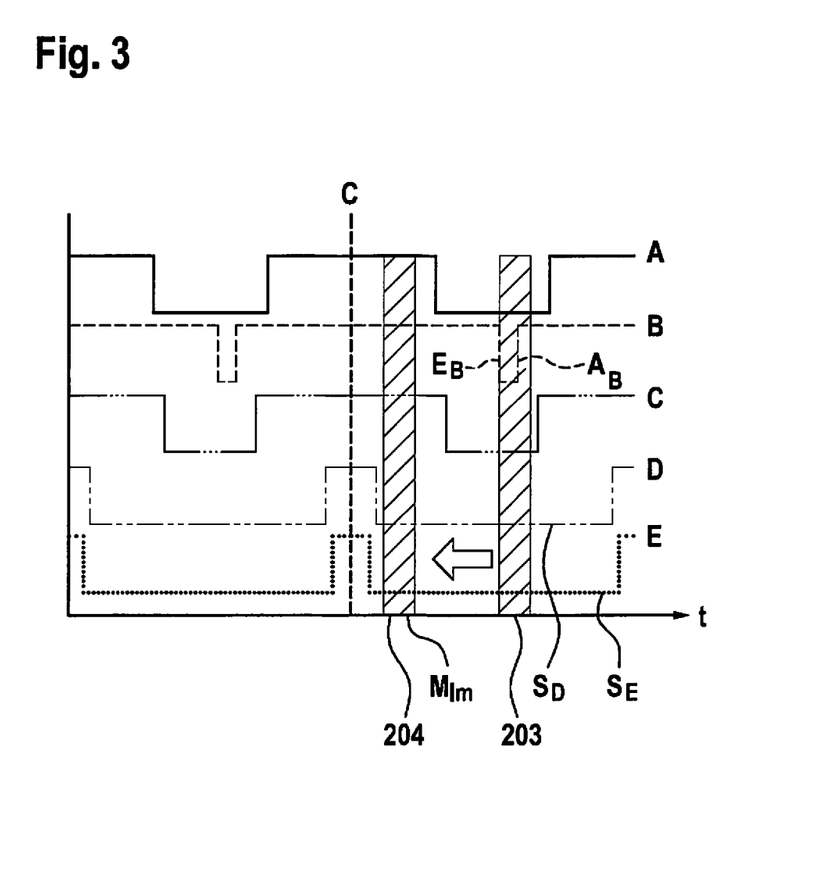
FIG. 3 shows a PWM activation diagram for an electric machine including a converter according to FIG. 1 and an ascertainment according to the present invention of phase currents in a schematic view.

A measurement may thus be carried out much more frequently and therefore depicts the real conditions more accurately. In particular the field-oriented control may be carried out more rapidly in this way with better control quality.

However, it is to be ensured that a measurement does not take place in periods in which a highside switch 2 and/or a lowside switch 3 is or are switched on and/or switched off, as is the case in period 203, for example (cf. phase B).

During such switching actions, potential jumps occur in stator windings 11 through 15, which corrupts a current measurement not only of the phase which is presently being connected, but rather all phases (as a result of coupling effects inside the stator). Moreover, the ascertainment of a corrupted current value of the measuring phases would result in a systematic error in the computation of the remaining phase currents, which is to be avoided.

A measuring interval $M_{l,m}$ is therefore selected and positioned with respect to time (indicated by the arrow in FIG. 3) in such a way that during measuring interval $M_{l,m}$, at least two of lowside switches 3 are switched on (switching interval $S_{D,E}$), measuring interval $M_{l,m}$ lasts long enough to ascertain the phase currents of the two measuring phases, for example, phases D and E, and moreover no switching actions (for example, switching-on point in time $E_B$ or switching-off point in time $A_B$) of highside switches 2 and/or lowside switches 3 take place within measuring interval $M_{l,m}$. A disadvantageous change of the pulse pattern may thus be avoided.

Figure 4:
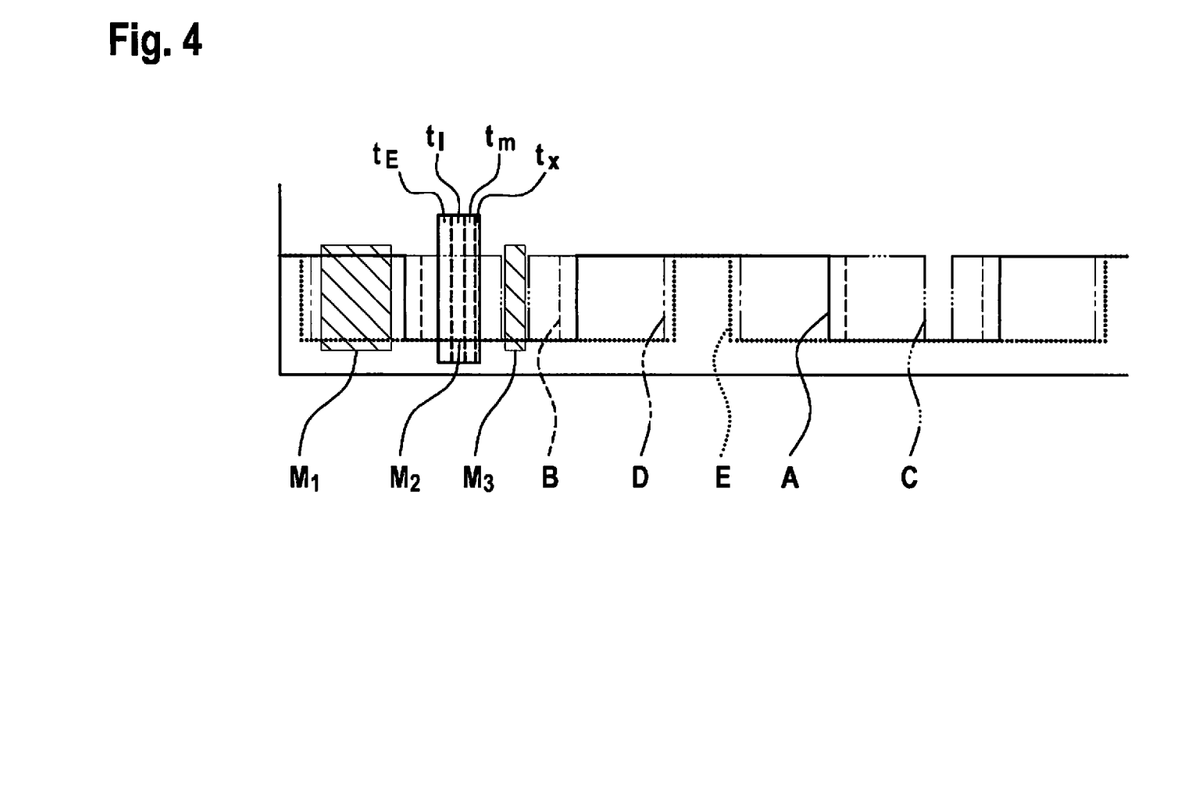
FIG. 4 shows a superposition with respect to time of a PWM activation diagram for an electric machine including a converter according to FIG. 1 and an ascertainment according to the present invention of a measuring interval for measuring phase currents in a schematic view.

The method according to the present invention for ascertaining the duration and the positioning with respect to time of measuring interval $M_{l,m}$ is described on the basis of FIG. 4. The activation pattern superimposed with respect to time of the switches of phases A through E is shown in FIG. 4, the curve of the activation of particular phases A through E being shown by different dashed lines. It is provided according to the present invention that the selection and the positioning with respect to time of measuring interval $M_{l,m}$ is carried out again for each switching cycle of highside switches 2 and/or lowside switches 3, which is shown by way of example for one switching cycle in FIG. 4.

The duration of a corresponding measuring interval $M_{l,m}$ is typically given by at least one settling time $t_E$ of at least one of stator windings 11 through 15, a first measuring time $t_l$ for measuring phase current $I_l$ of first measuring phase D and a further measuring time $t_m$ for measuring phase current $I_m$ of further measuring phase E. Settling time $t_E$ is typically between 10 μs and 20 μs (microseconds), in particular approximately 13 μs, and first measuring time $t_l$ and further measuring time $t_m$ are each between 2 μs and 10 μs, in particular approximately 3 μs.

These are merely typical values for a corresponding electric machine 10. It is understood in principle that the above-mentioned times may be adapted in accordance with the machine-side parameters.

To position a measuring interval $M_{l,m}$ in the best possible manner between the individual switching actions, switching-on points in time $E_{k,l,m}$ and switching-off points in time $A_{k,l,m}$ of highside switches 2 and/or lowside switches 3 are determined and sorted in accordance with their arrangement with respect to time. Subsequently, the time differences of directly adjacent switching actions are computed on the basis of ascertained switching-on points in time $E_{k,l,m}$ and switching-off points in time $A_{k,l,m}$ of highside switches 2 and/or lowside switches 3 (cf. FIG. 3). If the computed time difference is accordingly greater than the duration required for a single measurement of a phase current, possibly further taking into consideration settling time $t_E$ mentioned at the outset, it is thus checked how many further phase currents I are ascertainable within the available time window.

In principle, at least the phase currents of two measuring phases have to be ascertainable within measuring interval $M_{l,m}$. However, it is advantageous if possible to ascertain what may be many phase currents within particular measuring interval $M_{l,m}$, since in this way the computation of the further phase currents may be carried out with correspondingly higher accuracy. In this way, all measuring windows potentially corresponding to the requirements of a measuring interval $M_{l,m}$ are checked according to the above-mentioned criteria and measuring interval $M_{l,m}$ may be selected in which the greatest possible number of phase currents may be measured. This is shown by way of example in FIG. 4 on the basis of measuring windows $M_1$ through $M_3$.

Measuring window $M_1$ is sufficiently long for one phase current measurement, but only one phase (E) is switched to lowside within this time interval and the remaining phase currents are not measurable within this time interval. Since at least two phase currents have to be measurable, this time window is therefore excluded.

Measuring window $M_3$ is in a time interval in which all lowside switches 3 are switched through, because of which all phase currents of phases A through E are also measurable in principle. However, measuring window $M_3$ is short to such an extent that a phase current measurement of at least two measuring phases may not be effectuated. For this reason, this time window is excluded from the ascertainment of the phase currents.

Measuring window $M_2$ is sufficiently long for the phase current measurement of at least two measuring phases $t_l$ and $t_m$. In addition, measuring window $M_2$ also offers a sufficient time reserve to also accommodate settling time $t_E$ and at least the measurement of a phase current of a further measuring phase $t_x$. Therefore, measuring window $M_2$ may be measuring interval $M_{l,m}$, which may be ascertained within the scope of the method according to the present invention.

The arithmetic ascertainment of the remaining phase currents using the phase currents of two measuring phases, shown by way of example using only two measuring resistors in five-phase electrical machines, is explained hereafter. The principles explained here may be transferred by those skilled in the art to four-phase or multi-phase machines, as also indicated.

If one proceeds from a sinusoidal current curve $I(\varphi)=I_0 \times \sin \varphi$, all missing phase currents may be computed from two phase currents.

To compute a phase current value $I_{k(\varphi_0)}$ of a phase k from known (measured) current values $I_{l(\varphi_0)}$, $I_{m(\varphi_0)}$ of phases l and m, the following equation applies:

$$I_k(\varphi_0) = \frac{I_l(\varphi_0) - I_m(\varphi_0) \cdot \frac{\sin\delta_{kl}}{\sin\delta_{km}}}{\cos\delta_{kl} - \frac{\sin\delta_{kl}}{\tan\delta_{km}}}$$

The computation advantageously runs discretely, i.e., it is called with a certain cycle time. The present phase currents are computed once per cycle.

In this equation, $\delta_{kl}$ denotes the spatial angle offset between phase k and phase l. The spatial angle offset between two adjacent phases is 360°/N in the case of a typical symmetrical construction of the stator of the electric machine.

If, for example, with N=6 phases, the phase currents of phases 3 and 5 ($I_3$ and $I_5$) are measured, the following applies: l=3, m=5, and N=6. Therefore: $\delta_{13}=180°$ and $\delta_{15}=300°$.

If, for example, in a five-phase system having phases A through E, the phase current of phase A ($I_A$) is to be computed from the phase currents of phases B and C ($I_B$ and $I_C$), spatial angle offset $\delta_{AB}=360°/5=72°$ and spatial angle offset $\delta_{AC}=2\times360°/5=144°$.

The phase currents of the remaining phases ($I_D$ and $I_E$) may also be computed from $I_B$ and $I_C$, by using the particular difference angles.

Proceeding from this nomenclature, switching-on points in time $E_{k,l,m}$, switching-off points in time $A_{k,l,m}$, and switching intervals $S_{k,l,m}$ delimited with respect to time thereby also result, which correspond to highside switches 2 and/or lowside switches 3 associated with particular phases A through D (cf. FIG. 3). The switching-on points in time and switching-off points in time of highside switches 2 are inverse to those of lowside switches 3, as already mentioned at the outset.

The present invention is also particularly suitable for current measurement in the so-called block mode. From a certain speed, the so-called nominal speed, the electrical machine reaches the so-called voltage limit. In this case, the generated pole wheel voltage is greater than the voltage applied at the phases. In order that the machine may generate a motor torque above this speed, it is operated in so-called field weakening mode. However, since this operating mode has a lower efficiency, the nominal speed may be high, which may be achieved, for example, by a higher phase voltage. Therefore, corresponding machines are activated in the field weakening range in block mode instead of the above-explained PWM mode, since a greater effective voltage may be generated therein at the stator winding than in the case of PWM activation.

In contrast to the PWM activation, in the block mode, a fixed activation frequency is not used, but rather the switching elements are switched on and off in blocks synchronously with the electrical angular velocity of the electric machine. Various block widths may be implemented depending on the phase number. The type of activation which generates the greatest effective phase voltage is the so-called 180° block commutation, in which the highside and lowside switching elements (cf. FIG. 1) are each switched on for an electrical angle of 180° per phase within one electrical revolution.

In Table 1 below, the activation pattern in the case of 180° block commutation is shown for a five-phase electric machine. 10 different activation patterns result here within one electrical revolution, which are always switched over after an electrical angle of 36°. A switched-on highside switching element is denoted in each case by 1 and a switched-on lowside switching element is denoted by 0.

TABLE 1

| φ | A | B | C | D | E |
|---|---|---|---|---|---|
| 0° | 0 | 0 | 0 | 1 | 1 |
| 36° | 0 | 0 | 1 | 1 | 1 |
| 72° | 0 | 0 | 1 | 1 | 0 |
| 108° | 0 | 1 | 1 | 1 | 0 |
| 144° | 0 | 1 | 1 | 0 | 0 |
| 180° | 1 | 1 | 1 | 0 | 0 |
| 216° | 1 | 1 | 0 | 0 | 0 |
| 252° | 1 | 1 | 0 | 0 | 1 |
| 288° | 1 | 0 | 0 | 0 | 1 |
| 324° | 1 | 0 | 0 | 1 | 1 |

In relation to the PWM activation, it is noticeable that all (or at least all but one) lowside switching elements are not switched on simultaneously at any point in time. For a solely metrological ascertainment of the phase currents, such an activation, also referred to as a switching vector, therefore has to be induced solely for measuring purposes, by briefly switching on all (or all but one) lowside switching elements at defined points in time. However, this has the disadvantage that in this way the generated torque is reduced.

However, it is also apparent from the above table that at every point in time, at least two lowside switching elements are switched on. The present invention advantageously provides for always measuring the phase currents which are presently available, for example:

0°-71°: phases A and B

72°-143°: phases A and E

144°-215°: phases D and E

216°-287°: phases C and D

288°-359°: phases B and C

If the number of the measuring resistors is to be reduced, angle ranges result in which no current is measurable, since only lowside switching elements are closed in the phases with which no measuring resistors are associated. Since the block mode is only used at high speeds, these time ranges are possibly sufficiently small that computation may be carried out using the last ascertained phase currents.

The number of the angle segments without current measurement may be minimized by a metrologically advantageous placement of the measuring resistors, i.e., the current measuring points. The case of an electric machine including five phases and a converter, which corresponds, for example, to the arrangement shown in FIG. 1, is illustrated in Table 2 below. However, in this case only three measuring resistors are provided in phases A, B, and C.

The switching states of the switching elements, as explained with respect to Table 1, are shown in the left part of the table, a specification of the spatial angle of the associated phases having been omitted. The right part of the table shows how the individual phase currents are ascertained. Letter M means that the corresponding phase currents are measured, letters A through E indicate from which phase currents the phase currents indicated in the header line are determined arithmetically (for example, first line: $I_A$, $I_B$, and $I_C$ are measured, $I_D$ and $I_E$ are determined arithmetically from $I_A$ and $I_C$).

TABLE 2

| A | B | C | D | E | $I_A$ | $I_B$ | $I_C$ | $I_D$ | $I_E$ |
|---|---|---|---|---|-------|-------|-------|-------|-------|
| 0 | 0 | 0 | 1 | 1 | M | M | M | A, C | A, C |
| 0 | 0 | 1 | 1 | 1 | M | M | A, B | A, B | A, B |
| 0 | 0 | 1 | 1 | 0 | M | M | A, B | A, B | A, B |
| 0 | 1 | 1 | 1 | 0 | M | — | — | — | — |
| 0 | 1 | 1 | 0 | 0 | M | — | — | — | — |
| 1 | 1 | 1 | 0 | 0 | — | — | — | — | — |
| 1 | 1 | 0 | 0 | 0 | — | — | M | — | — |
| 1 | 1 | 0 | 0 | 1 | — | — | M | — | — |
| 1 | 0 | 0 | 0 | 1 | B, C | M | M | B, C | M |
| 1 | 0 | 0 | 1 | 1 | B, C | M | M | B, C | M |

It is apparent that in this case a measurement of the phase currents of two phases, and thus an ascertainment of the phase currents of all phases, is only possible in five of the ten angle segments (corresponding to table lines 1, 2, 3, 9, and 10), since only in these segments two of the lowside switching elements are closed in phases A, B, and C. In all other angle segments, no or only one phase current may be measured, so that the remaining phase currents may not be ascertained.

In the arrangement on which Table 3 below is based, which otherwise also corresponds to that of FIG. 1 and the representation in Table 2, in contrast, two measuring resistors are present in a common supply line of phases A and D and also C and E and a further measuring resistor in phase B. It is apparent that in this case the phase currents of all phases may be ascertained in eight of ten angle segments.

TABLE 3

| A | B | C | D | E | $I_A$ | $I_B$ | $I_C$ | $I_D$ | $I_E$ |
|---|---|---|---|---|-------|-------|-------|-------|-------|
| 0 | 0 | 0 | 1 | 1 | M | M | M | AC | AC |
| 0 | 0 | 1 | 1 | 1 | M | M | AB | AB | AB |
| 0 | 0 | 1 | 1 | 0 | M | M | AE | AE | M |
| 0 | 1 | 1 | 1 | 0 | M | AE | AE | AE | M |
| 0 | 1 | 1 | 0 | 0 | — | — | — | — | M |
| 1 | 1 | 1 | 0 | 0 | DE | DE | DE | M | M |
| 1 | 1 | 0 | 0 | 0 | — | — | — | M | — |
| 1 | 1 | 0 | 0 | 1 | CD | CD | M | M | CD |
| 1 | 0 | 0 | 0 | 1 | CD | M | M | M | CD |
| 1 | 0 | 0 | 1 | 1 | BC | M | M | BC | BC |

The phase currents of all phases may only be computed if the lowside switching elements in phases A and D and C and E, respectively, are switched on simultaneously, since in this case their individual phase currents may not be measured.

In the arrangement on which Table 4 below is based, two measuring resistors are provided in phases A and B. The arrangement otherwise corresponds to that of FIG. 1, the representation to Tables 2 and 3. It is apparent that in this case a current measurement is only possible in the first three of the ten angle segments, since the lowside switching elements of phases A and B are only closed here. In all other angle segments, no phase current or only one phase current may be measured, so that the phase currents of the other phases may not be ascertained.

TABLE 4

| A | B | C | D | E | $I_A$ | $I_B$ | $I_C$ | $I_D$ | $I_E$ |
|---|---|---|---|---|-------|-------|-------|-------|-------|
| 0 | 0 | 0 | 1 | 1 | M | M | A, B | A, B | A, B |
| 0 | 0 | 1 | 1 | 1 | M | M | A, B | A, B | A, B |
| 0 | 0 | 1 | 1 | 0 | M | M | A, B | A, B | A, B |
| 0 | 1 | 1 | 1 | 0 | M | — | — | — | — |
| 0 | 1 | 1 | 1 | 0 | M | — | — | — | — |
| 1 | 1 | 1 | 0 | 0 | — | — | — | — | — |
| 1 | 1 | 0 | 0 | 0 | — | — | — | — | — |
| 1 | 1 | 0 | 0 | 1 | — | — | — | — | — |
| 1 | 0 | 0 | 0 | 1 | — | M | — | — | — |
| 1 | 0 | 0 | 1 | 1 | — | M | — | — | — |

In the arrangement on which Table 5 below is based, in contrast, two current sensors are present in a common supply line of phases A and D and also C and E. In this case, all phase currents may be ascertained in six of ten angle segments. This is not possible if either only two lowside switching elements are closed and one thereof is in phase B or the lowside switching elements in phases A and D and C and E, respectively, are closed simultaneously, since the individual phase currents of these phases may then not be ascertained.

The method may be optimized still further if necessary, by a further lowside switching element being switched on in each of the non-measurable angle segments for a short time, which is referred to in the language of this application as "setting a measuring mode of the converter." As described above, a slightly lower torque is generated in this way, but the loss is significantly lower here, since a switching intervention is only required in one phase.

TABLE 5

| A | B | C | D | E | $I_A$ | $I_B$ | $I_C$ | $I_D$ | $I_E$ |
|---|---|---|---|---|-------|-------|-------|-------|-------|
| 0 | 0 | 0 | 1 | 1 | M | A, C | M | A, C | A, C |
| 0 | 0 | 1 | 1 | 1 | M | — | — | — | — |
| 0 | 0 | 1 | 1 | 0 | M | A, E | A, E | A, E | M |

TABLE 5-continued

| A | B | C | D | E | $I_A$ | $I_B$ | $I_C$ | $I_D$ | $I_E$ |
|---|---|---|---|---|-------|-------|-------|-------|-------|
| 0 | 1 | 1 | 1 | 0 | M | A, E | A, E | A, E | M |
| 0 | 1 | 1 | 0 | 0 | — | — | — | — | M |
| 1 | 1 | 1 | 0 | 0 | D, E | D, E | D, E | M | M |
| 1 | 1 | 0 | 0 | 0 | — | — | — | M | — |
| 1 | 1 | 0 | 0 | 1 | C, D | C, D | M | M | C, D |
| 1 | 0 | 0 | 0 | 1 | C, D | C, D | M | M | C, D |
| 1 | 0 | 0 | 1 | 1 | — | — | M | — | — |

What is claimed is:

1. A method for ascertaining the phase currents of an electric machine, the method comprising:
    measuring, the electric machine including a converter and a stator including stator windings having a phase number of at least three, the phase currents of a number of measuring phases, which is at least two, are measured, the phase currents of the measuring phases each being measured in a measuring interval when active switching elements associated with the measuring phases in a lowside path of the converter are activated in a switching interval which is delimited by a switching-on point in time and a switching-off point in time, the phase currents of the remaining phases being determined arithmetically from the measured phase currents so that at least the measured phase currents, a spatial angle of the measuring phases, and a spatial angle of the remaining phases are used for the arithmetic determination;
    wherein the measuring interval is selected so that the switching-on point in time and the switching-off point in time of at least one of the active switching elements of the converter associated with the phases of the stator lie with respect to time outside of the measuring interval,
wherein the switching-on points in time and the switching-off points in time are determined and sorted in chronological sequence, a time difference between one of the switching-on points in time or one of the switching-off points in time and a directly adjacent one of the switching-on points in time or of the switching-off points in time is determined and compared to the measuring interval.

2. The method of claim 1, wherein the measuring interval includes at least one settling time of at least one of the stator windings, a first measuring time for measuring a phase current of a first measuring phase and a further measuring time for measuring a phase current of a further measuring phase.

3. The method of claim 1, wherein the measuring interval is selected so that the switching-on points in time and the switching-off points in time of the active switching elements in a highside path of the converter and/or the active switching elements in a lowside path of the converter associated with the phases of the stator lie with respect to time outside the measuring interval.

4. The method of claim 1, wherein the measuring interval is selected and situated with respect to time between the switching-on points in time or switching-off points in time so that the time difference at least corresponds to the measuring interval.

5. The method of claim 1, wherein the measuring interval is selected and situated with respect to time between the switching-on points in time or switching-off points in time so that at least two phase currents are measurable within the measuring interval.

6. The method of claim 1, wherein the switching-on points in time and the switching-off points in time are recurring with respect to time, in particular periodically, and the measuring interval is ascertained again for each cycle.

7. The method of claim 1, wherein it is carried out in the case of pulse width modulation mode and/or block mode of the converter.

8. The method of claim 1, wherein the phase currents of at least two measuring phases are measured in the form of an aggregate current.

9. The method of claim 1, wherein the spatial angle of the measuring phases and the remaining phases are determined on the basis of a geometrical arrangement of the measuring phases and the remaining phases in the electric machine.

10. The method of claim 1, wherein the measuring interval includes at least one settling time of at least one of the stator windings, a first measuring time for measuring a phase current of a first measuring phase and a further measuring time for measuring a phase current of a further measuring phase, the settling time being between 10 microseconds and 20 microseconds, and the first measuring time and the further measuring time each being between 2 microseconds and 10 microseconds.

11. The method of claim 10, the settling time being 13 microseconds, and the first measuring time and the further measuring time each being 3 microseconds.

12. The method of claim 1, wherein the determined time difference between the one of the switching-on point in time or the one of the switching-off point in time and the directly adjacent one of the switching-on points in time or of the switching-off points in time is compared to the duration of the measuring interval.

13. The method of claim 1, wherein the measuring interval is selected and situated with respect to time between the switching-on points in time or switching-off points in time so that at least two phase currents, which are the greatest possible number of phase currents, are measurable within the measuring interval.

14. A processing unit for ascertaining the phase currents of an electric machine, comprising:
a processor configured to measure, the electric machine including a converter and a stator including stator windings having a phase number of at least three, the phase currents of a number of measuring phases, which is at least two, are measured, the phase currents of the measuring phases each being measured in a measuring interval when active switching elements associated with the measuring phases in a lowside path of the converter are activated in a switching interval which is delimited by a switching-on point in time and a switching-off point in time, the phase currents of the remaining phases being determined arithmetically from the measured phase currents so that at least the measured phase currents, a spatial angle of the measuring phases, and a spatial angle of the remaining phases are used for the arithmetic determination;
wherein the measuring interval is selected so that the switching-on point in time and the switching-off point in time of at least one of the active switching elements of the converter associated with the phases of the stator lie with respect to time outside the measuring interval,
wherein the switching-on points in time and the switching-off points in time are determined and sorted in chronological sequence, a time difference between one of the switching-on points in time or one of the switching-off points in time and a directly adjacent one of the switching-on points in time or of the switching-off points in time is determined and compared to the measuring interval.

15. A motor vehicle electrical system, comprising:
a processing unit for ascertaining the phase currents of an electric machine, including:
a processor configured to measure, the electric machine including a converter and a stator including stator windings having a phase number of at least three, the phase currents of a number of measuring phases, which is at least two, are measured, the phase currents of the measuring phases each being measured in a measuring interval when active switching elements associated with the measuring phases in a lowside path of the converter are activated in a switching interval which is delimited by a switching-on point in time and a switching-off point in time, the phase currents of the remaining phases being determined arithmetically from the measured phase currents so that at least the measured phase currents, a spatial angle of the measuring phases, and a spatial angle of the remaining phases are used for the arithmetic determination;
wherein the measuring interval is selected so that the switching-on point in time and the switching-off point in time of at least one of the active switching elements of the converter associated with the phases of the stator lie with respect to time outside of the measuring interval,
wherein the switching-on points in time and the switching-off points in time are determined and sorted in chronological sequence, a time difference between one of the switching-on points in time or one of the switching-off points in time and a directly adjacent one of the switching-on points in time or of the switching-off points in time is determined and compared to the measuring interval.

16. A non-transitory computer readable medium having computer program, which is executable by a processor, comprising:
a program code arrangement having program code for ascertaining the phase currents of an electric machine, the electric machine including a converter and a stator including stator windings having a phase number of at least three, by performing the following:
measuring the phase currents of a number of measuring phases, which is at least two, are measured, the phase currents of the measuring phases each being measured in a measuring interval when active switching elements associated with the measuring phases in a lowside path of the converter are activated in a switching interval which is delimited by a switching-on point in time and a switching-off point in time, the phase currents of the remaining phases being determined arithmetically from the measured phase currents so that at least the measured phase currents, a spatial angle of the measuring phases, and a spatial angle of the remaining phases are used for the arithmetic determination;
wherein the measuring interval the switching-on point in time and the switching-off point in time of at least one of the active switching elements of the converter associated with the phases of the stator lie with respect to time outside of the measuring interval,
wherein the switching-on points in time and the switching-off points in time are determined and sorted in chronological sequence, a time difference between one of the switching-on points in time or one of the switching-off points in time and a directly adjacent one of the switching-on points in time or of the switching-off points in time is determined and compared to the measuring interval.

17. The computer readable storage medium of claim 16, wherein the measuring interval includes at least one settling time of at least one of the stator windings, a first measuring time for measuring a phase current of a first measuring phase and a further measuring time for measuring a phase current of a further measuring phase.

\* \* \* \* \*